United States Patent [19]
Lee

[11] Patent Number: 5,510,789
[45] Date of Patent: Apr. 23, 1996

[54] ALGORITHMIC A/D CONVERTER WITH DIGITALLY CALIBRATED OUTPUT

[75] Inventor: Hae-Seung Lee, Arlington, Mass.

[73] Assignee: Analog Devices, Incorporated, Norwood, Mass.

[21] Appl. No.: 412,269

[22] Filed: Mar. 28, 1995

Related U.S. Application Data

[63] Continuation of Ser. No. 60,754, May 12, 1993, abandoned.

[51] Int. Cl.⁶ .................................................. H03M 1/10
[52] U.S. Cl. ........................... 341/120; 341/163; 341/172
[58] Field of Search .................................... 341/118, 120, 341/161, 162, 163, 172

[56] References Cited

U.S. PATENT DOCUMENTS

| | | | |
|---|---|---|---|
| 4,399,426 | 8/1983 | Tan | 341/120 |
| 4,415,882 | 11/1983 | Akazawa et al. | 341/172 |
| 4,745,394 | 5/1988 | Cornett | 341/118 |
| 4,748,440 | 5/1988 | Kobayashi | 341/158 |
| 4,760,376 | 7/1988 | Kobayashi et al. | 341/172 |
| 4,894,657 | 1/1990 | Hwang et al. | 341/158 |
| 5,027,116 | 6/1991 | Armstrong et al. | 341/120 |
| 5,212,486 | 5/1993 | Nagaraj | 341/172 |

OTHER PUBLICATIONS

"CMOS Analog Circuit Design", P. E. Allen and D. R. Holberg, (1987) pp. 565–570.

*Primary Examiner*—Howard L. Williams
*Attorney, Agent, or Firm*—Parmelee, Bollinger & Bramblett

[57] ABSTRACT

A multistage pipelined algorithmic A/D converter digitally calibrated to avoid errors due to charge injection, offset and capacitor mismatch. To perform this calibration, measurements are made at the converter to determine the degree of capacitor mismatch for each stage to be calibrated. In the embodiment disclosed, only one stage is calibrated. The remaining stages of the converter are employed to develop the digital calibration data for the stage being measured. This calibration data is stored in a memory forming part of the converter. The stored data is thereafter used during each conversion to cancel the errors due to capacitor mismatch.

18 Claims, 5 Drawing Sheets

ALGORITHMIC A/D CONVERTER WITH DIGITALLY CALIBRATED OUTPUT

This application is a continuation of application Ser. No. 08/060,754 as originally filed on May 12, 1993, now abandoned.

BACKGROUND OF THE INVENTION

1. Field of the Invention

This invention relates to analog-to-digital (A/D) converters. More particularly, this invention relates to such converters of the algorithmic type having a cascaded series of stages each producing a corresponding bit for an output digital word. Such a cascaded series of stages is sometimes referred to as a pipelined arrangement.

2. Description of the Prior Art

Algorithmic converters of various kinds have been known in the art for many years. A pipelined algorithmic A/D converter is described in the textbook "CMOS Analog Circuit Design" by Phillip E. Allen and Douglas R. Holberg (1987) at page 565 et seq. FIG. 1 of this application is reproduced from that description, and shows a cascaded one-bit/stage converter which carries out an algorithm wherein the input voltage to each stage is doubled and combined with plus or minus $V_{REF}$, depending upon the sign of the input voltage to each stage as determined by a respective comparator. The signals for the pipelined stages are shifted between the stages under clock control, and the delay between shifts is diagrammatically represented by the blocks "$Z^{-1}$".

Such algorithmic converters have a number of sources of error including comparator offset voltage and charge injection from transistor switches commonly used in carrying out the algorithm. The multiply-by-two function is conveniently performed by an amplifier using a pair of switchable capacitors. With such an amplifier circuit, gain errors will be caused by capacitor mismatch, resulting in differential nonlinearity (DNL) and integral nonlinearity (INL). The errors from comparator offset and charge injection can be substantially neutralized by employing a modified algorithm using two comparators per stage, to carry out a so-called 1.5 bit/stage algorithm. However, errors due to capacitor mismatch are not reduced by such an algorithm. The present invention is directed to minimizing errors from capacitor mismatch in such a converter by means of a self-calibration technique which functions entirely in the digital domain.

SUMMARY OF THE INVENTION

In a preferred embodiment of the present invention, to be described in detail hereinbelow, measurements are made at the converter to determine the degree of capacitor mismatch for each stage to be calibrated. For practical reasons, it generally only is necessary to calibrate several (possibly just one) of the most-significant-bit (MSB) stages. The remaining stages of the converter are, in the preferred embodiment described, employed to develop the digital calibration data for the stage being measured. This calibration data is stored in a memory forming part of the converter. The stored data is thereafter used during each conversion to cancel the errors due to capacitor mismatch.

DETAILED DESCRIPTION OF A PREFERRED EMBODIMENT

Figure 1:
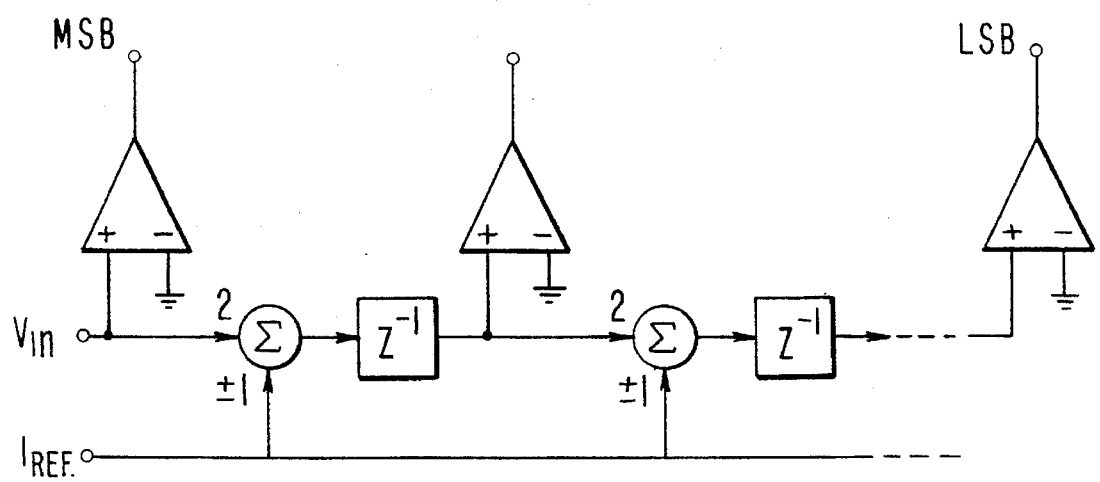
FIG. 1 is a block diagram illustrating a prior art pipelined algorithmic A/D converter.
Figure 2:
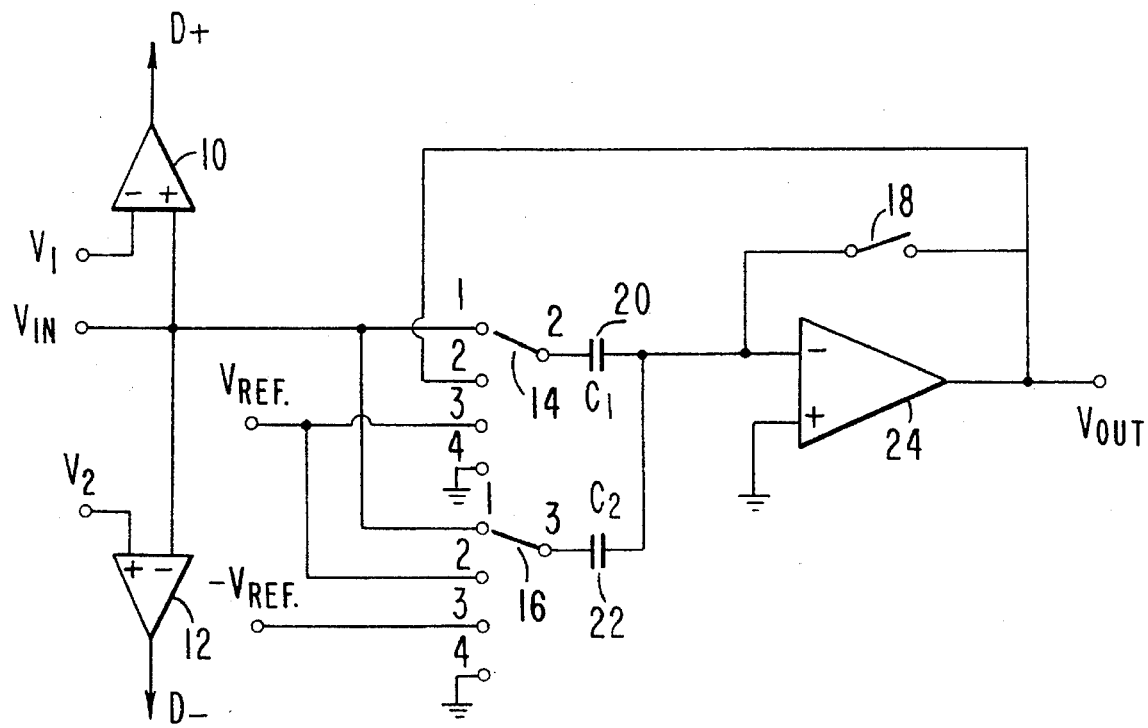
FIG. 2 is a circuit diagram showing basic elements of one stage of a converter in accordance with this invention.

FIG. 2 shows elements of a single stage of a pipelined converter in accordance with the invention. A series of such stages are cascaded in the complete converter to obtain high resolution. The output of one stage serves as the input to the next stage.

The input voltage $V_{IN}$ for the single stage of FIG. 2 is connected to two comparators 10, 12 for comparison with respective voltages $V_1$ (positive) and $V_2$ (negative). The digital output D+ of the comparator 10 is "1" if $V_{IN}$ is greater than $V_1$; otherwise D+ is zero. The digital output D− of the other comparator 12 is "1" if $V_{IN}$ is more negative than $V_2$; otherwise D− is zero.

The input voltage $V_{IN}$ also is directed to input terminals at position 1 of each of two switches 14, 16. These switches also have positions 2, 3, 4 where the switch is connected to other nodes of the stage circuitry including reference voltages $V_{REF}$ and $-V_{REF}$. For proper operation of the converter, the positive comparator voltage $V_1$ must be greater than zero and less than $V_{REF}/2$, and the negative voltage $V_2$ must be between $-V_{REF}/2$ and zero. The accuracies of $V_1$ and $V_2$ are not significant in the functioning of the converter. Advantageously, $V_1$ may be one-half of $V_{REF}$ and $V_2$ may be one-half of $-V_{REF}$.

A pair of capacitors 20, 22 have their right-hand plates connected to the inverting input of an op amp 24. The left-hand plates are connectible by switches 14, 16 respectively to terminals at switch positions 1–4. The first switch 14 selects from $V_{IN}$, $V_{OUT}$, $V_{REF}$ and ground, while the second switch 16 selects from $V_{IN}$, $V_{REF}$, $-V_{REF}$ and ground. $V_{REF}$ and $V_{-REF}$ are the positive and negative full-scale voltages respectively, and typically are supplied from external sources. A switch 18 is connected between the inverting input of the op amp 24 and its output voltage $V_{OUT}$.

Figure 3:
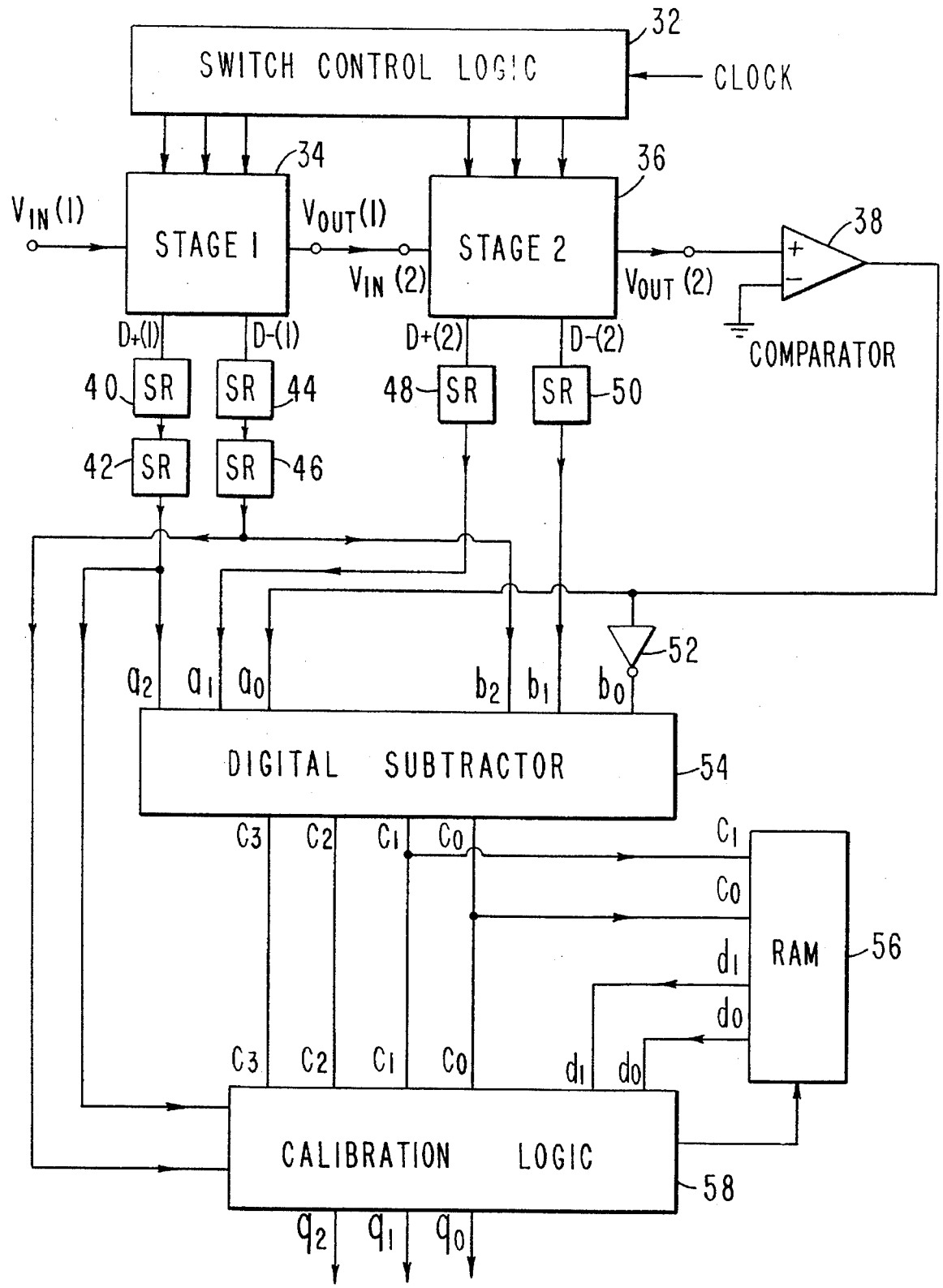
FIG. 3 is a block diagram showing a multi-stage converter system in accordance with this invention.

FIG. 3 shows in block format a converter system wherein individual stages as disclosed in FIG. 2 are cascaded as part of a complete converter. This embodiment includes means to produce only a 3-bit output, in order to simplify the presentation. It will be understood that a commercially practicable converter would include more stages, such as 12 or 14 in total. The general principles applicable to such further stages are however the same as in the simplified arrangement.

The first two stages 34, 36 of the 3-bit converter are the same as shown in FIG. 2, and for simplicity are shown in block format. The third (and last) stage is however a comparator, since no further stages are present to be supplied with input signals. A switch control logic 32 is coupled to the first two stages to receive the comparator signals D+ and D−, and to produce control signals to control the positions of the switches 14, 16 as will be described.

The converter input voltage $V_{IN}(1)$ is applied to the first stage 34. The output voltage $V_{OUT}(1)$ of the first stage is fed to the input of the second stage 36, and identified as $V_{IN}(2)$. The last stage is a comparator 38 the input of which is connected to the output of the second stage.

The digital outputs D+(1) and D−(1) of the first stage comparators 10, 12 are shifted by two clock phases by shift registers 40, 42, 44 and 46. The digital outputs D+(2) and D−(2) of the second stage comparators are shifted by one clock phase by shift registers 48 and 50. The output $a_2$ of the shift register 42, the output $a_1$ of the shift register 48, and the output of $a_0$ of the comparator 38 are connected to one input port of a digital subtractor 54. The output $b_2$ of the shift register 42, the output $b_1$ of the shift register 48, and the output $b_0$ of the inverter 52 are connected to another input port of the digital subtracter 54. The digital subtractor 54 subtracts the digital number $b_2b_1b_0$ from the digital number $a_2a_1a_0$ to produce a 4-bit signed digital output $c_3c_2c_1c_0$. The last two bits $c_1$ and $c_0$ of the subtractor 54 are connected to the input of a random-access memory (RAM) 56, and transferred to the RAM as part of the pre-operation calibration cycles to be described hereinafter. A calibration logic 58 takes the digital output $c_3c_2c_1c_0$ of the subtractor 54 and the digital output $d_1d_0$ of the RAM 56 and generates a final digital output $q_2q_1q_0$. The calibration logic 58 is controlled by the outputs $a_2$ and $b_2$ of the shift registers 42 and 44.

Figure 4:
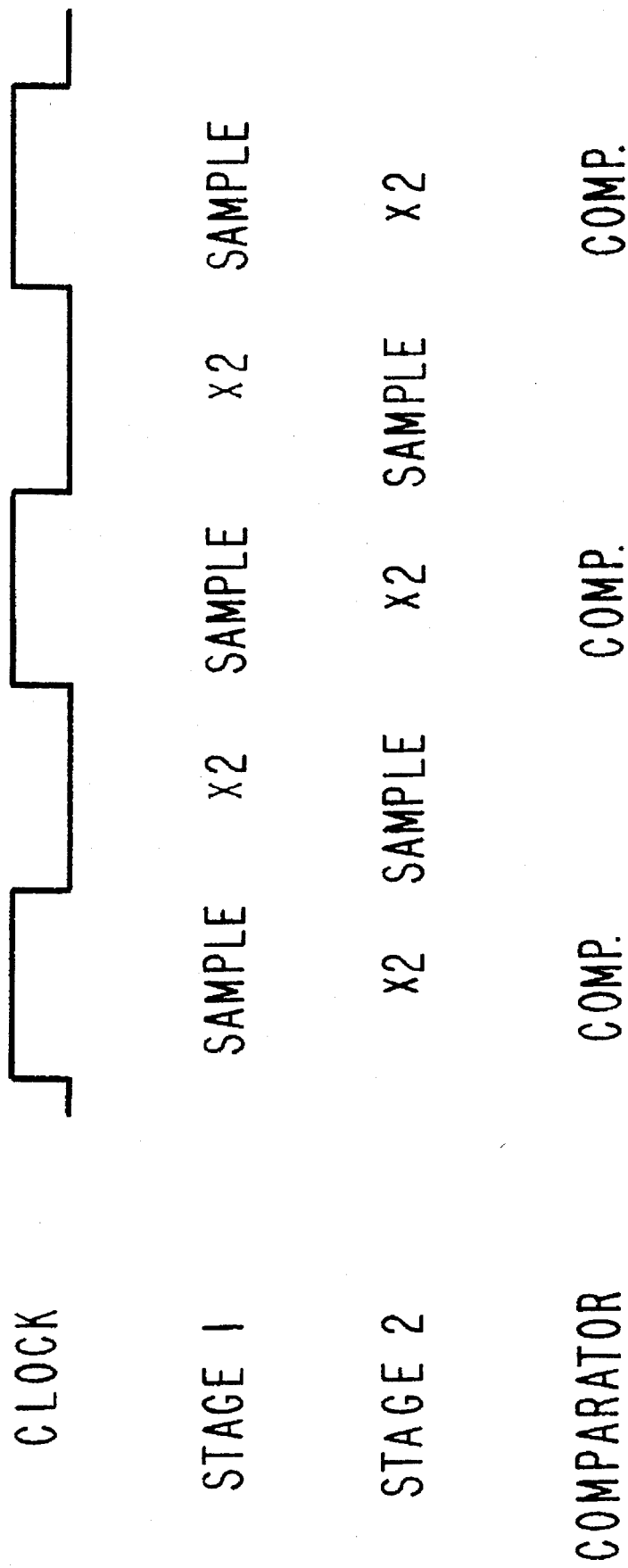
FIG. 4 is a timing diagram showing the clock waveform for sequential stages of the converter.

The 3-bit A/D converter described above is controlled by clock pulses the waveform of which is shown in FIG. 4 together with the operational phases of the first stage 34, the second stage 36, and the comparator 38. The operation of each stage has two phases, the sampling phase and the multiply-by-2 phase. During the sampling phase, denoted as SAMPLE in FIG. 4, the stage samples the input voltage presented to its input. Referring to FIG. 2, during the sampling phase, the switch 18 is closed (on), and the switches 14 and 16 are both in position 1.

Figure 5A:
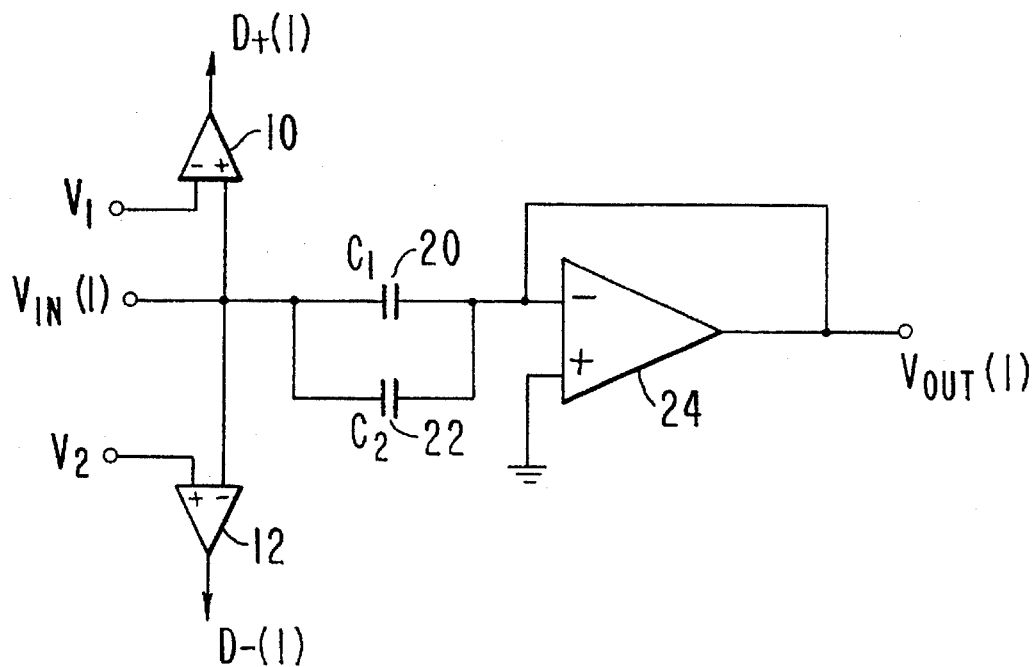
FIGS. 5A and 5B show two circuit configurations for the two capacitors of a single stage of the converter during its operation.
Figure 5B:
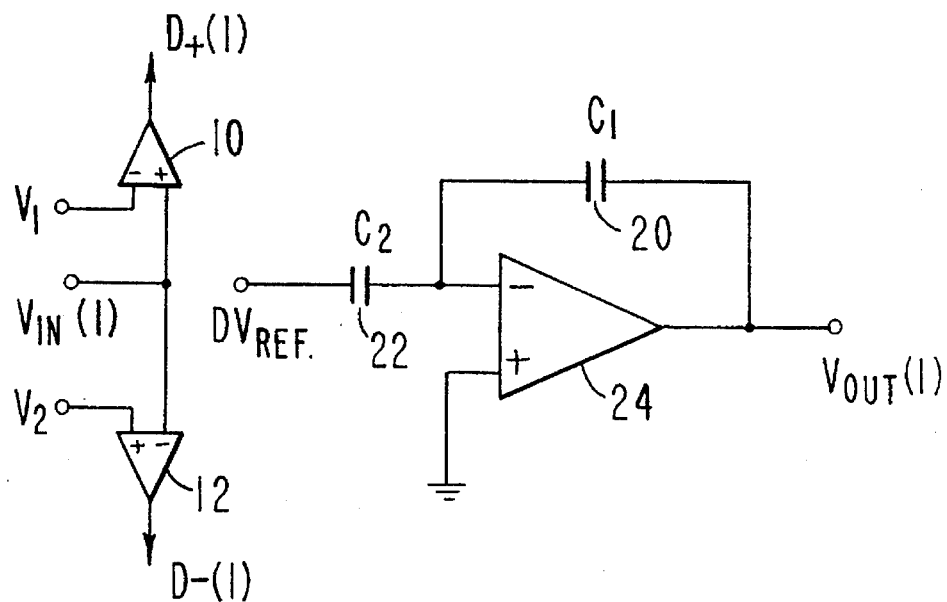

The circuit configuration of the first stage 34 during the sampling phase is shown somewhat simplified in FIG. 5A. Switches 14, 16, and 18 have been omitted for clarity, and only the resulting configuration is shown. At this time, the comparators 10 and 12 compare the input voltage $V_{IN}(1)$ with $V_1$ and $V_2$ producing corresponding digital outputs D+(1) and D−(1). During the multiply-by-2 phase, denoted as X2 in FIG. 4, and with a circuit configuration as shown in FIG. 5B, the stage multiplies the input voltage $V_{IN}(1)$ sampled during the sampling phase by 2, and subtracts $V_{REF}$, −$V_{REF}$, or 0 from the resulting output. During the multiply-by-2 phase, the switch 18 is opened (off), the switch 14 is placed in position 2, and the switch 16 is placed in position 2, 3, or 4 depending on the value of D+(1) and D−(1) determined in the previous sampling phase. The switch control logic 32 in FIG. 3 takes the outputs D+(1) and D−(1) and controls the position of the switch 16 as follows during the multiply-by-2 phase:

| $V_{IN}(1)$ | D+(1) | D−(1) | Position of Switch 16 |
|---|---|---|---|
| $V_{IN}(1)>V_1$ | 1 | 0 | 2 |
| $V_2<V_{IN}(1)<V_1$ | 0 | 0 | 4 |
| $V_{IN}(1)<V_2$ | 0 | 1 | 3 |

When the switch 16 is placed in positions 2, 3, and 4, $V_{REF}$, −$V_{REF}$, and ground are connected to the left plate of the capacitor 22, respectively. If the capacitors 20 and 22 have identical values and if switch 18 causes no charge injection, it can be shown that the resulting output voltage $V_{OUT}(1)$ of the first stage 34 at the end of the multiply-by-2 phase is:

$$V_{OUT}(1)=2V_{IN}-D+(1)V_{REF}+D-(1)V_{REF} \quad (1)$$

This output voltage is presented to the input of the second stage 36 which then processes the signal the same way, producing digital outputs D+(2) and D−(2), and producing the output voltage $V_{OUT}(2)$ for the comparator 38.

If both the first stage 34 and the second stage 36 are ideal (i.e., identical capacitors 20 and 22, and no charge injection), the following relation is obtained between the input voltage $V_{IN}(1)$ and the code $c_3c_2c_1c_0$ when converted into decimal values for easier understanding.

| $V_{IN}(1)$ | ($c_3c_2c_1c_0$ decimal value) | ($c_3c_2c_1c_0+7$)/2 |
|---|---|---|
| $V_{IN}(1)<-¾V_{REF}$ | −7 | 0 |
| $-¾V_{REF}<V_{IN}(1)<-½V_{REF}$ | −5 | 1 |
| $-½V_{REF}<V_{IN}(1)<-¼V_{REF}$ | −3 | 2 |
| $-¼V_{REF}<V_{IN}(1)<0$ | −1 | 3 |
| $0<V_{IN}(1)<¼V_{REF}$ | 1 | 4 |
| $¼V_{REF}<V_{IN}(1)<½V_{REF}$ | 3 | 5 |
| $½V_{REF}<V_{IN}(1)<¾V_{REF}$ | 5 | 6 |
| $V_{IN}(1)>¾V_{REF}$ | 7 | 7 |

From the above table, it is evident that the relation is similar to an ideal 3-bit A/D converter. This is more apparent in the third column where 7 is added and the result is divided by two to obtain codes ranging from 0 to 7.

The ideal A/D conversion characteristic in the above table is disturbed if the values of capacitors 20 and 22 are not identical or charge injection is introduced when the switch 18 is opened. Consider for example that the capacitor 20 in the first stage 34 has the value C while the capacitor 22 in the first stage has a value $(1+\alpha)C$, and an offset $V_{OS}$ is added to the output voltage $V_{OUT}(1)$ when the switch 18 in the first stage is turned off. For simplicity in analysis, it may be assumed that the second stage is ideal.

The output voltage $V_{OUT}(1)$ of the first stage 34 at the end of the multiply-by-2 phase in that case is:

$$V_{OUT}(1)=(2+\alpha)V_{IN}(1)-D+(1)(1+\alpha)V_{REF}+D-(1)(1+\alpha)V_{REF}+V_{OS} \quad (2)$$

This output voltage is presented to the input of the second stage 36, and converted into a 2-bit digital value by the second stage 36 and the comparator 38. However, compared with the ideal case in equation (1) the voltage in equation (2) is in error due to the capacitor mismatch $\alpha$ between the capacitors 20 and 22, and due to the offset voltage $V_{OS}$. The amount of error $V_{error}$ introduced at the input of the second stage 36 can therefore be calculated by subtracting the ideal voltage in equation (1) from the actual voltage in equation (2), with the following result:

$$V_{error}=\alpha V_{IN}(1)-D+(1)\alpha V_{REF}+D-(1)\alpha V_{REF}+V_{OS} \quad (3)$$

As will be described later, the values $V_{OS}$ and $\alpha$ are measured during "calibration" cycles that precede normal operations of the A/D converter, and are stored in the RAM 56 in FIG. 3. Therefore, values $V_{OS}$ and $\alpha$ are already known when normal operation of the conversion starts. Since the digital values of $\alpha$, $V_{OS}$, D+(1) and D−(1) are all known, the second, the third, and the fourth terms on the right-hand side of equation (3) are readily calculated, as by conventional logic circuitry. The remaining term $\alpha V_{IN}(1)$ can also be calculated by digitally multiplying $\alpha$ with the digital value of $V_{IN}(1)$ obtained from the digital codes $a_2a_1a_0$ and $b_2b_1b_0$. It can be shown that the digital value of $\alpha V_{IN}(1)$ obtained this way is accurate despite the error estimating $V_{IN}(1)$ due to the errors in equation (2). Therefore the error $V_{error}$ in equation (3) can be precisely calculated by the calibration logic 58. The digital value of $V_{error}$ then is digitally subtracted from the uncalibrated output $c_2c_1c_0$ by the calibration logic 58, resulting in an accurate 3-bit digital code $q_2q_1q_0$.

As discussed above, the A/D converter embodying the invention will first go through "calibration" cycles during which the values of $V_{OS}$ and $\alpha$ are measured for each stage to be calibrated and stored in the RAM 58, before the converter is operated to perform a conversion. Again, for simplicity, the calibration cycle for measuring the values of $V_{OS}$ and $\alpha$ of the first stage 34 is described while the second stage is assumed to be ideal. Calibration of any further stages as desired will be carried out in the same way.

Figure 6A:
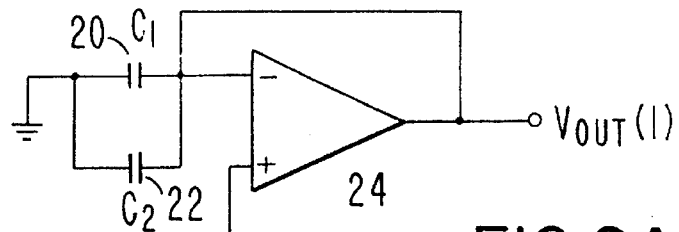
FIGS. 6A and 6B show two circuit configurations for the two capacitors of FIGS. 5A and 5B, when measurements are being made of certain characteristics of the converter stage to be calibrated.
Figure 6B:
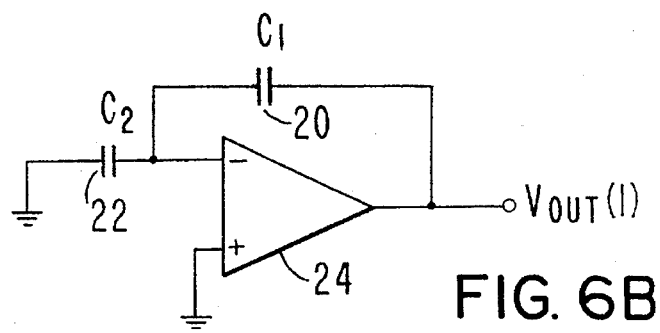

First, the offset $V_{OS}$ of the first stage 34 is measured by placing both of the switches 14 and 16 in position 4 so that the left plates of capacitors 20 and 22 in the first stage are connected to ground, and the switch 18 is closed (on). The resulting configuration is shown in FIG. 6A, where comparators and switches are omitted for clarity. During the second phase, the switch 18 is opened, resulting in charge injection that manifests itself as the offset voltage $V_{OS}$. The switch 14 is shifted to position 2, and the switch 16 is shifted to position 4, giving the configuration in FIG. 6B. The output voltage $V_{OUT}(1)$ in this case is exactly $V_{OS}$. Since this is presented as the input to the second stage, $V_{OS}$ is converted into a 2-bit digital value by means of the 2-bit A/D converter comprising the second stage 36 and the comparator 38. The result is stored in the RAM 56 to be used during the normal operation of the A/D converter as described previously.

Figure 7A:
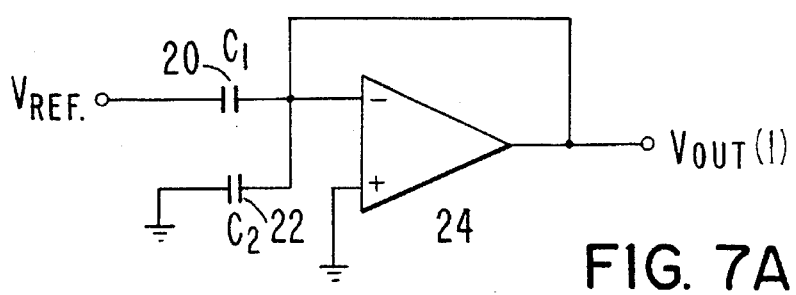
FIGS. 7A and 7B show the capacitors of FIGS. 6A and 6B in circuit configurations to effect measurements of other characteristics of the converter stage to be calibrated.
Figure 7B:
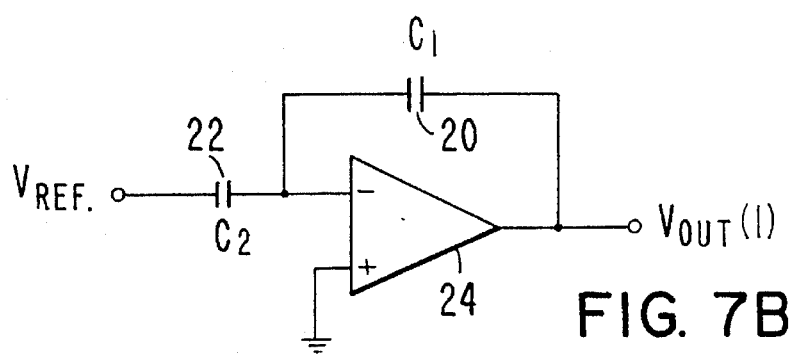

Next, the capacitor mismatch error $\alpha$ is measured. This measurement also is done in two phases. During the first phase, as shown in FIG. 7A, the left plate of capacitor 20 is connected to $V_{REF}$ while that of the capacitor 22 is connected to ground. Again, the comparators and switches are omitted for clarity. During the second phase (FIG. 7B) the switch 18 is opened, the left plate of the capacitor 22 is connected to $V_{REF}$, and that of capacitor 20 is connected to $V_{OUT}(1)$. The output in this case is given by:

$$V_{OUT}(1) = \alpha V_{REF} + V_{OS} \qquad (4)$$

The output voltage contains the same $V_{OS}$ here, as before, because the switch 18 injects the same amount of charge as before when it is turned off. This voltage is converted into a 2-bit digital value by means of the 2-bit A/D converter comprising the second stage 36 and the comparator 38. The value of $\alpha V_{REF}$ then can readily be determined by subtracting from this value the previously determined value of $V_{OS}$ which has already been stored in the RAM 56. The resulting digital value of $\alpha V_{REF}$ is stored in the RAM 56 to be used during the normal operation of the A/D converter as described previously. $V_{OS}$ and $\alpha V_{REF}$ are stored in corresponding memory locations, accessible for further calculations for determining the final calibration factor.

The transfer of the 2-bit measurement signals $(c_1c_2)$ to the RAM 56, the computations with respect to those numbers, and the transfer to the calibration logic 58 of the calibration data $(d_1d_0)$ are controlled by conventional processing logic, not shown in detail, but which may be incorporated in the calibration logic 58, or in separate logic associated with the RAM 56. This processing can be carried out in various ways. For example, the digital values of $V_{OS}$ and $\alpha$ may be directly stored in first and second locations of the RAM 56, respectively, during the calibration cycles as described previously.

First, during the offset measurement part of the calibration cycle, the last two bits of the measurement $(c_1c_0)$ is the digital representation of the offset $V_{OS}$. This quantity is stored as a 2-bit digital data in the first location of the RAM 56. During the mismatch ($\alpha$) measurement part of the cycle, the last two bits of the measurement $(c_1c_0)$ correspond to a digital representation of $\alpha V_{REF} + V_{OS}$ as discussed previously in relation to equation (4). The calibration logic subtracts from this value $V_{OS}$ which was already stored in the first location of the RAM 56. This leaves a two-bit digital value $\alpha V_{REF}$ as a result. This two-bit digital data is stored in the second location of the RAM 56.

During the normal conversion sequences, the calibration logic addresses the first location of the RAM 56 first. At this time, the output $(d_1d_0)$ is the value corresponding to $V_{OS}$. The calibration logic 58 subtracts this value $(d_1d_0)$ from $(c_3c_2c_1c_0)$ effectively removing $V_{OS}$ from $V_{OUT}(1)$ given in equation (2). Thus, the resulting new digital output $(c_3c_2c_1c_0)'$ contains no offset. Next, the calibration logic 58 addresses the second location of the RAM. At this time, the output $(d_1d_0)$ is the value corresponding to $\alpha V_{REF}$. The digital calibration logic 58 multiplies the value $(d_1d_0)$ with $(a_2-b_2)$ which is the delayed value of D+(1)−D−(1). The result, $\alpha(a_2-b_2) V_{REF}$, is subtracted from $(c_3c_2c_1c_0)'$ resulting in $(c_3c_2c_1c_0)''$. This operation removes the error −D+(1)$\alpha V_{REF}$+D−(1)$\alpha V_{REF}$ from the output given in equation (2). Finally, the calibration logic digitally multiplies $(d_1d_0)$ with $(c_3c_2c_1c_0)''$, which is an estimation of $V_{IN}(1)/V_{REF}$. The result, $\alpha V_{IN}(1)$, is subtracted from $(c_3c_2c_1c_0)''$, and the last bit is truncated giving a three-bit data $q_2q_1q_0$. It will be seen that $q_2q_1q_0$ represents an accurate digital representation of $V_{IN}(1)$, because all errors in equation (2) have been removed in the process described above.

The technique disclosed herein can be applied to any cyclic or pipelined algorithmic converters, does not require extra clock cycles during the conversion, and no additional analog circuitry is needed. The analog circuit is extremely simple, using one operational amplifier and two latches per stage. The 1.5 bit/stage algorithm makes a simple self-calibration possible in the digital domain. The combination of digital error correction and calibration removes any error due to capacitor mismatch, charge injection, comparator errors including offset and noise. Since the comparator decision error up to ¼ full scale is corrected, the comparator can be strobed before the op amp has fully settled. Therefore the comparator decision delay does not cut into the conversion time. Moreover, a simple latch can be used as a comparator. For these reasons, the converter presented here can operate at a maximum possible rate limited only by op amp settling times.

In this two comparator algorithm, any comparator error including offset is eliminated, and the charge injection manifests itself only as overall input referred offset voltage. However, the capacitor mismatch gives rise to DNL and INL and must be corrected by the digital calibration. Although a fully-differential configuration is preferred in practice, a single-ended version is shown for simplicity. In the fully differential circuit, matching between $V_{REF}$ and $-V_{REF}$ is not necessary.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In an algorithmic A/D converter of the type wherein at least one stage employs a circuit having two capacitors with means for switching said two capacitors successively into different circuit-connection configurations wherein the switching between two such configurations effects a mathematical function, and wherein errors in the converter output will occur if there is mismatch of said two capacitors;

the method of calibrating said converter to avoid such errors comprising the steps of:

exercising said one stage by connecting said two capacitors in said circuit successively between a first set of different circuit-connection configurations;

developing a digital measure of mismatch of said two capacitors from a circuit effect produced by said exercising of said one stage between said first set of circuit-connection configurations;

storing said digital measure of mismatch in a memory device; and utilizing said digital measure of mismatch with the digital output of said converter to effect calibration thereof whenever a conversion is performed.

2. The method of claim 1, wherein said mathematical function is to multiply a voltage value by a constant.

3. The method of claim 2, wherein said function is to double said voltage value.

4. The method of claim 1, for use in calibrating a multi-stage A/D converter with said circuit serving as one stage thereof, and wherein said digital representation is produced by a process including the step of applying an output voltage from said circuit to at least one less-significant-bit stage of said converter and developing therefrom a corresponding digital signal for use in developing said digital representation.

5. The method of claim 1, for use in calibrating one stage of a multi-stage A/D converter wherein said one stage includes two comparators for comparing the stage input signal $V_{IN}$ with different voltage levels $V_1$ and $V_2$ such that:

| $V_{IN}$ | D+ | D− |
|---|---|---|
| $V_{IN}(1) > V_1$ | 1 | 0 |
| $V_2 < V_{IN}(1) < V_1$ | 0 | 0 |
| $V_{IN}(1) < V_2$ | 0 | 1 | where D+ and D− are the outputs of the two comparators.

6. The method of claim 1, including the step of developing, by exercising said one stage, a digital representation of offset voltage; and storing said offset voltage representation in said memory device to be used for obtaining said digital output of said converter.

7. The method of claim 1, wherein said one stage circuit comprises an operational amplifier receiving the input signal, said method further including the step of developing a digital measure of offset voltage ($V_{os}$) for said amplifier; and utilizing said digital measure of offset voltage with the digital output of said converter to effect calibration thereof whenever a conversion is performed.

8. The method of claim 1, including the step of comparing the analog input signal to said one stage with two different voltages to establish a digital output signal for said one stage.

9. In an algorithmic A/D converter having at least one stage comprising a pair of nominally equal-valued capacitors with means for switching said capacitors successively between different circuit-connection configurations to provide a multiply-by-two mathematical function, and wherein mismatch of said capacitors in such stage can develop errors in the converter output signal;

said converter further comprising:

an output register to receive the digital output of the converter;

memory means forming part of said converter;

said memory means containing digital calibration data for said at least one stage and representing the degree of said capacitor mismatch; and means for utilizing the digital calibration data from said memory means with the digital output signal in said output register to provide a calibrated final digital output signal for the converter.

10. Apparatus as in claim 9, wherein said memory means includes digital calibration data representing offset voltage and to be used in providing said calibrated final output signal.

11. Apparatus as claimed in claim 9 including means responsive to the output of said one stage to develop said digital calibration data for said stage.

12. Apparatus as claimed in claim 11, wherein said responsive means comprises means for exercising said one stage by connecting said capacitors in said two different circuit-connection configurations to develop a measure of capacitor mismatch.

13. Apparatus as claimed in claim 12, wherein said responsive means includes means to produce a digital measure of said mismatch.

14. Apparatus as claimed in claim 13, including means to place said measure of mismatch in said memory means for use as said digital calibration data.

15. In a multi-stage algorithmic A/D converter of the type wherein at least one stage comprises two capacitors with means for switching said capacitors between different circuit-connection configurations to provide a function, and wherein mismatch of said capacitors in such stage can develop errors in the converter output signal;

said converter further comprising:

an output register to receive the digital output of the converter;

memory means forming part of said converter;

said memory means containing digital calibration data for said at least one stage and representing the degree of said capacitor mismatch;

means to exercise said one stage by successively connecting said two capacitors between a first set of different circuit-connection configurations;

means operable with a second converter stage following said one stage while said one stage is being exercised to develop from said second stage digital calibration data for said memory means; and means for utilizing the digital calibration data from said memory means with the digital output signal in said output register to provide a calibrated final digital output signal for the converter.

16. Apparatus as claimed in claim 15, wherein the switching of said two capacitors between said two circuit-connection configurations performs a multiply-by-two mathematical function on the input voltage to that stage.

17. Apparatus as in claim 15, wherein said one stage comprises two comparators to compare the analog input signal to that stage with two different voltages, thereby to assure that there are no missing quantization levels in the conversion to a digital signal.

18. In a multi-stage algorithmic A/D converter of the type wherein at least one stage comprises two capacitors with means for switching said capacitors between different circuit-connection configurations to provide a function, and wherein mismatch of said capacitors in such stage can develop errors in the converter output signal;

the method of calibrating said one converter stage comprising:

exercising said one stage by successively connecting said two capacitors between a first set of different circuit-connection configurations;

while said one stage is being exercised, directing the output of said one stage to the input of a following stage;

utilizing said following stage to produce a digital measure of the mismatch of said two capacitors; and in a subsequent operation of said A/D converter, combining said digital measure of mismatch with the output of the converter to provide a calibrated final digital output signal for the converter.

* * * * *